Jan. 14, 1969 B. TOPAS 3,421,962

APPARATUS FOR DICING SEMICONDUCTOR WAFERS

Filed April 5, 1965

INVENTOR
BENJAMIN TOPAS

BY

OSTROLENK, FABER, GERB & SOFFEN

ATTORNEYS

United States Patent Office 3,421,962
Patented Jan. 14, 1969

3,421,962
APPARATUS FOR DICING SEMICONDUCTOR WAFERS
Benjamin Topas, Santa Monica, Calif., assignor to International Rectifier Corporation, El Segundo, Calif., a corporation of California
Continuation-in-part of application Ser. No. 218,706, Aug. 22, 1962. This application Apr. 5, 1965, Ser. No. 445,683
U.S. Cl. 156—345 1 Claim
Int. Cl. C23f 1/04

ABSTRACT OF THE DISCLOSURE

A method and apparatus for etch-cutting semiconductor wafers in which an acid-resistant frame having a threaded post is used, with one end of the post carrying a first mask and the bottom of the frame carrying a second mask. A wafer to be cut is laid on the bottom mask and the post is threaded toward the wafer until the first mask and second mask are clamped on the opposite surfaces of the wafer. The wafer and frame are then immersed into an acid solution which etches the area exposed around the outer periphery of the masks.

This invention relates to a novel method for cutting semiconductor wafers, and more specifically relates to a novel method for cutting such wafers in an etching bath. This application is a continuation-in-part of my copending application Ser. No. 218,706, filed Aug. 22, 1962, entitled, "Method for Dicing Semiconductor Wafter" (now abandoned).

It will be understood that, while the invention is described below in connection with preferred embodiments thereof involving the cutting of silicon wafers, the cutting of other known semiconductor materials, e.g., germanium, is included within the scope of the invention.

In the manufacture of semiconductor elements, it is often necessary that the semiconductor wafer be cut or diced in a predetermined shape. Many methods of cutting or dicing wafers are well known, and usually require some type of sawing action with a diamond saw. It has been found that this method causes mechanical stress within the wafer, and thus causes certain adverse effects in the operation of the semiconductor element after it is diced.

Accordingly, a principal object of the present invention is to provide a novel method for cutting, slicing or dicing semiconductor wafers without causing adverse mechanical stresses within the wafer.

Another object of this invention is to provide such a method for cutting large area semiconductor wafers into small area single crystal wafers.

Other objects and advantages of the invention will be apparent from the following detailed description thereof.

In accordance with the present invention, the semiconductor wafer to be cut is immersed in an etching medium supported between opposing masks of a relatively inert material, e.g., constituted of polyethylene, polytetrafluoroethylene ("Teflon") or other inert plastic, to thereby cut or dice the wafer into small area elements defined by the mask surfaces. The masks are clamped about the wafer, providing a pressure contact sealing off the portion of the wafer which is not to be etched and defining peripheral edges at which the etchant cuts through or dissolves the wafer.

The wafer is immersed in the etching medium or solution for a period of from about 1 to 5 minutes. Typical etching media include hydrofluoric acid, nitric acid, mixtures of hydrofluoric acid and nitric acid or aqua regia etchants. The concentration of the etchant in the etching solution can be varied as desired, relatively dilute solutions producing a more uniform etch than relatively higher concentration solutions. The etching medium may also contain a weak acid, e.g., acetic acid, as a moderator, and an oxidizing agent, e.g., hydrogen peroxide. Etching media employed in accordance with the invention include a concentrated aqueous solution of hydrofluoric acid and an aqueous mixture containing 3 parts hydrofluoric acid, 5 parts nitric acid and 3 parts acetic acid.

The nature and objects of the invention will best be understood in the light of the following description of preferred embodiments thereof taken in connection with the accompanying drawing in which.

Figure 1:
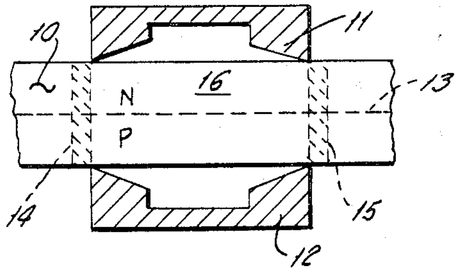
FIGURE 1 is a side elevation of a silicon wafer clamped between opposed masking elements prior to immersing the wafer in an etching medium.

Referring initially to FIGURE 1, and in accordance with the present invention, a wafer 10 of silicon is clamped between first and second polyethylene masking members 11 and 12. The wafer 10 can, for example, have a P-N junction 13 therein, and may have a thickness of the order of about 0.010 inch. The cross-sectional area and lateral configuration of the polyethylene masks 11 and 12 are related to the desired dimensions of the diced element to be taken from wafer 10.

In accordance with the invention, the masks 11 and 12 are supported by any appropriate supporting means, and clamp the wafer 10 under pressure. The resulting assembly is then lowered into an etching medium, e.g., a bath of hydrofluoric acid maintained at room temperature.

The acid etchant attacks the wafer particularly at the wafer portions 14 and 15 immediately adjacent the periphery of masks 11 and 12, and the reaction proceeds more quickly in these areas than in areas remote from the periphery of the mask. For this reason, the seal between the wafer surface and the sealing periphery of masks 11 and 12 is not opened during the etching process, it being particularly noted that "undercutting" has been found to be substantially negligible, particularly in view of the very thin wafers being etched. That is to say, where wafers being etched have a thickness of the order of 0.01 inch, the etching proceeds more rapidly in the transverse direction than in the lateral direction so that undercutting is negligible. It has also been found that the etchant reacts more quickly with the N-type regions of the silicon wafer above junction 13 than with the P-type regions below the junction.

It will be particularly noted that the area removed by the etch is rougly localized about the periphery of masks 11 and 12. The wafer 10 can be etched completely through around the periphery of masks 11 and 12 by purely chemical means, while the remaining wafer portions removed from the masks are unaffected. Thus, the area 16 of the wafer lying between masks 11 and 12 can be effectively diced from the main wafer portion 10.

Figure 3:
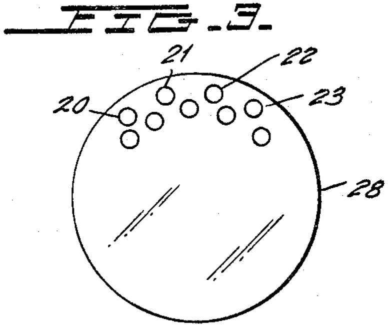
FIGURE 3 is a top view of the assembly of FIGURE 2.
Figure 2:
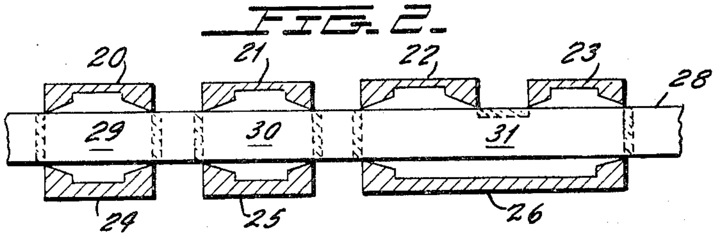
FIGURE 2 is a view similar to FIGURE 1, illustrating the manner in which a plurality of opposing masks can support a large area wafer, whereupon dipping the entire assembly into a bath causes the large area wafer to be diced into a plurality of small area wafers in a single operation.

The novel method of the invention can be best utilized in the manner shown in FIGURES 2 and 3, wherein a plurality of masking elements such as elements 20 through 23 are supported from a common upper jig or support member (not shown) which cooperates with a lower jig having registering mask members such as members 24 through 26. The registering mask members may be idenical, as are masks 20 and 21 and opposing masks 24 and 25, respectively, or may have varying configurations, as illustrated by masks 22, 23 and opposing mask 26, to produce semiconductor elements having any desired shapes. The upper and lower jigs can support a large area wafer 28 which could, for example, have an area of the order of about one square inch.

Figure 4:
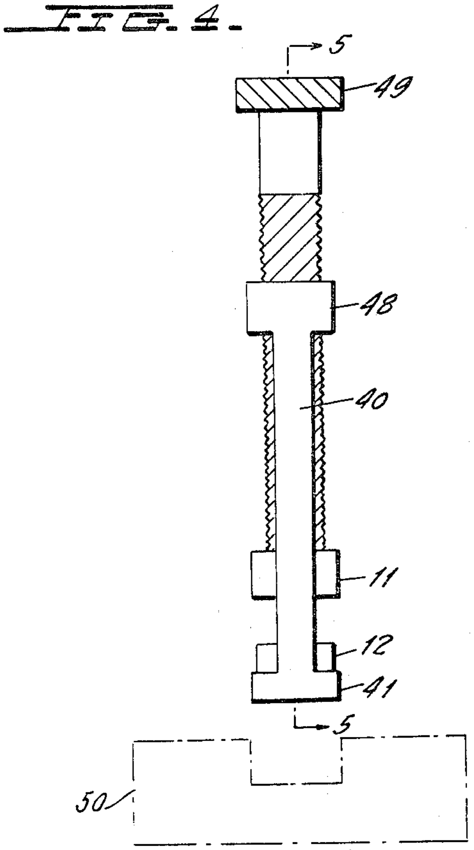
FIGURE 4 is a side plan view of a fixture for removably clamping the wafer of FIGURE 1 and removably supporting the opposing masking members 11 and 12 with respect to the wafer.
Figure 5:
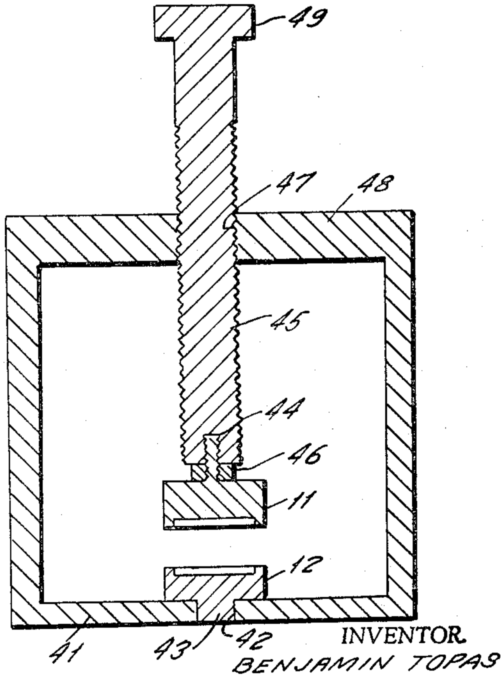
FIGURE 5 is a cross-sectional view of FIGURE 4 when taken across the lines 5—5 in FIGURE 4.

FIGURES 4 and 5 illustrate a particular support for carrying the masks 11 and 12 shown in FIGURE 1. Thus, in the figures, a general rectangular frame 40 which is of any suitable material such as polyethylene is provided with a base section 41 which has an opening 42 therein. The lower mask 12 then has a projecting pedestal 43 which is slidably secured into opening 42, thereby to rigidly fix the position of mask 12. Note that the mask 12, shown in FIGURE 5, is provided with square shoulders as contrasted to the conical engaging surface shown in FIGURES 1 and 2 where the square shoulder has been found to serve as a suitable seal about some predetermined wafer area.

The upper mask 11 is then provided with an extending threaded post 44 which is threaded into a suitable polyethylene bolt 45 with a polyethylene washer 46 interposed between mask 11 and bolt 45. Note that the engaging surface of mask 11 also has the square shoulder similar to that shown for mask 12.

Prior to assembling the mask 11 to the bottom of bolt 45, the bolt is threaded through the threaded opening 47 in the top frame 48 of member 40. The bolt 47 may then be provided with a knurled head 49 which serves as both a carrying handle for the assemblage and as a means for tightening the masks 11 and 12 onto an interposed wafer.

Thus, in operation, a suitable wafer such as the wafer 16 is interposed between masks 11 and 12 which have some suitable diameter determined by the diameter of the wafer to be diced. Thereafter, the bolt 45 is tightened so that the masks 11 and 12 are tightened against the opposing wafer surfaces and by using the knurled head 49 as a handle, the assemblage is dipped into some suitable etch material with the etchant attacking the wafer in the manner illustrated in FIGURE 1. Thereafter, the assemblage is removed from the etchant and immersed into a rinsing solution with the wafer being suitably etched from the main wafer body.

If desired, and as illustrated in dotted lines in FIGURE 4, a suitable plastic pedestal 50 can be snapped onto the bottom of frame 41 to serve as a support for the entire assemblage within the etchant bath.

Although this invention has been described with respect to its preferred embodiments, many variations and modifications will now be obvious to those skilled in the art, and it is preferred, therefore, that the scope of the invention be limited not by the specific disclosure herein but only by the appended claim.

The embodiments of the invention in which an exclusive privilege or property is claimed are defined as follows:

1. An apparatus for etch-cutting semiconductor wafers comprising a rectangular support frame of acid-resistant material; said frame having a top section, a base section, and side members connecting said top section and base section; a threaded post of acid-resistant material threaded through said top section of said rectangular support frame; a first mask means of acid-resistant material connected to the bottom of said threaded post; a second mask means of acid-resistant material connected to the interior of said base section; said first and second mask means facing one another and aligned with one another and having parallel wafer engaging portions disposed perpendicular to the axis of said threaded post; the rotation of said threaded post moving said first mask means toward said second mask means, whereby a wafer to be etched can be secured between said first and second mask means.

References Cited

UNITED STATES PATENTS

| | | | |
|---|---|---|---|
| 2,944,321 | 7/1960 | Westberg | 29—25.3 |
| 3,046,176 | 7/1962 | Bosenberg | 156—11 |
| 3,140,527 | 7/1964 | Valdman et al. | 29—25.3 |
| 2,820,312 | 1/1958 | Coontz | 156—345 |

JACOB H. STEINBERG, *Primary Examiner.*

U.S. Cl. X.R.

156—17, 16